(12) United States Patent
Wu

(10) Patent No.: US 10,251,251 B2
(45) Date of Patent: Apr. 2, 2019

(54) ELECTROSTATIC DISSIPATION DEVICE WITH STATIC SENSING AND METHOD THEREOF

(71) Applicant: Yi Jing Technology Co., Ltd., Kaohsiung (TW)

(72) Inventor: Kuan-Ting Wu, Kaohsiung (TW)

(73) Assignee: YI JING TECHNOLOGY CO., LTD, Kaohsiung (TW)

( * ) Notice: Subject to any disclaimer, the term of this patent is extended or adjusted under 35 U.S.C. 154(b) by 268 days.

(21) Appl. No.: 15/014,980

(22) Filed: Feb. 3, 2016

(65) Prior Publication Data

US 2017/0223813 A1    Aug. 3, 2017

(51) Int. Cl.
| | |
|---|---|
| H05F 3/04 | (2006.01) |
| G06F 1/16 | (2006.01) |
| G01R 31/00 | (2006.01) |
| H01T 23/00 | (2006.01) |
| G11C 29/56 | (2006.01) |

(52) U.S. Cl.
CPC ............... *H05F 3/04* (2013.01); *G01R 31/00* (2013.01); *G06F 1/16* (2013.01); *G11C 29/56016* (2013.01); *H01T 23/00* (2013.01)

(58) Field of Classification Search
CPC .. G05B 15/02; G06F 8/63; G06F 1/16; H04B 10/116; H04B 10/502; H05B 33/0845; H05B 33/0857; H05B 37/0272; H05F 3/04; H05F 3/06; H01T 23/00; G01R 31/00; G11C 29/56016
USPC ........................................................ 361/213
See application file for complete search history.

(56) References Cited

U.S. PATENT DOCUMENTS

| | | | | |
|---|---|---|---|---|
| 3,745,413 A * | 7/1973 | Whitmore | ............... | H01T 23/00 |
| | | | | 361/229 |
| 4,901,194 A * | 2/1990 | Steinman | ................ | H01T 23/00 |
| | | | | 250/423 R |
| 5,420,743 A * | 5/1995 | Domes | ................... | B65H 37/00 |
| | | | | 361/214 |
| 5,506,744 A * | 4/1996 | Rush | ........................ | H05F 3/04 |
| | | | | 361/220 |
| 2002/0000984 A1* | 1/2002 | Asai | ....................... | G09F 27/00 |
| | | | | 345/211 |
| 2003/0218855 A1* | 11/2003 | Goldenberg | ............ | H01T 23/00 |
| | | | | 361/213 |

(Continued)

FOREIGN PATENT DOCUMENTS

TW        I435659 B        4/2014

*Primary Examiner* — Thienvu V Tran
*Assistant Examiner* — Nicolas Bellido
(74) *Attorney, Agent, or Firm* — Muncy, Geissler, Olds & Lowe, P.C.

(57) ABSTRACT

An electrostatic dissipation device with static sensing is applicable to dissipate electrostatic charges on an object, comprising an ion transmitting unit, an ion generating unit, and astatic sensing unit. The static value of the object is provided as feedback to the ion generating unit by the static sensing unit, and the ions with polarity opposing to the static value of the object are generated by the ion generating unit, by which adequate air flow generated by the ion transmitting unit is blown to the object for ion neutralization, so that the static can be dissipated. When the static of the object is dissipated, the operation of the ion transmitting unit and the ion generating unit are ceased, so the power of the electrostatic dissipation can be saved.

10 Claims, 6 Drawing Sheets

(56) References Cited

U.S. PATENT DOCUMENTS

| | | | |
|---|---|---|---|
| 2005/0063130 A1* | 3/2005 | Francis | H01T 23/00 361/220 |
| 2007/0133145 A1* | 6/2007 | Sato | H01T 19/04 361/220 |
| 2009/0015263 A1* | 1/2009 | Nakajima | G01R 19/0061 324/457 |
| 2009/0168288 A1* | 7/2009 | Hashimoto | H01T 23/00 361/213 |
| 2009/0219663 A1* | 9/2009 | Sato | H01T 23/00 361/220 |

* cited by examiner

ELECTROSTATIC DISSIPATION DEVICE WITH STATIC SENSING AND METHOD THEREOF

BACKGROUND OF THE INVENTION a) Field of the Invention

The present invention relates to an electrostatic dissipation device, and more particularly to an electrostatic dissipation device with static sensing and method thereof.

b) Description of the Related Art

The demand of semiconductor products steadily increases, and consumers turn to look for lighter, thinner, shorter and smaller electronic products. In addition, the feature size of electronic parts is continually minimized, and following the improvement of the semiconductor package, technological breakthrough is developed to comply with the demand of the electronic products markets.

Moreover, the manufacturing costs and added value of semiconductor products are high, and product performance is critical in determining the function of electronic goods. Therefore, each phase of the semiconductor manufacturing process, as well as each semiconductor chip, are undergone through numerous tests and examinations to assure the quality of final electronic products.

In general, testing process of the semiconductor product means the communication and appearance testing of the packaged chip, including like material preparation, tester testing, electrical testing, label scanning, automatic or manual foot selecting, foot testing and fixing, packaging, and so on, in which, the handler in the tester testing is used to determine whether the semiconductor product under test is ruined during the processes or is damaged by static. Static arises from ion movements between contact and separation of objects which causes an object to carry positive or negative charges. Semiconductor products in small size are easily pierced, burned or damaged by electrostatic discharge to be ineffective. Therefore, how to prevent static is an important issue for semiconductor manufacturers to address.

Most of semiconductor manufacturing processes are performed in the clean room, wherein the lower relative humidity tends to accumulate static, so the existence of static is unavoidable. The current electrostatic protection includes such as anti-static wrist straps, anti-static shoes, anti-static blower and anti-static bar. In the semiconductor manufacturing processes, semiconductor chips are automatically or manually shifted from a semiconductor carrier (like semiconductor tray) to a present tester by operators, after those semiconductor products under test are completed with testing one by one, they are shifted from the present testing machine to semiconductor tray. Different testing processes are performed by different machines, so the semiconductor products are necessary to be shifted to different machines for next test. In the shifting, if any electrostatic contamination occurs because of ineffective electrostatic protection resulted from operators' personal ignorance or equipment problem, the semiconductor chips undergone tens or hundreds of processes are ruined at once.

Please refer to FIG. 1, which concerns Taiwan Invention Patent No. 1435659, entitled "A static eliminator", which is applicable to eliminate static of work piece. The static eliminator 1 is disposed on the bottom side of the long and slender box 1a, and plural, here means eight, main discharge electrode units 2 and four additional discharge electrode units 3 are partitioned and disposed on the long side. Furthermore, the four additional discharge electrode units 3 are optional to assemble based upon the users' choice, and the basic structure of the additional discharge electrode unit 3 and the main discharge electrode unit 2 are similar.

The method of pulse width modulation (PWM) is adopted by the static eliminator 1, by which the main discharge electrode unit 2 and the additional discharge electrode unit 3 are driven to discharge positive or negative ions, so that the electrostatic charges of work piece can be eliminated.

From the above descriptions, certain problems still exist in the prior art device:

1. Energy Wasting

In old times, the positive and negative ions are continually released for eliminating static, no matter whether any work piece exists on the testing zone, the ions are still continually generated by the static eliminator in high voltage, even though electrostatic balance is obtained, the equivalent positive and negative ions are released by the static eliminator to cause energy wasting.

2. Inadequate Electrostatic Elimination

The blowholes are disposed at intervals on the discharge needle in the prior art device, although it can prevent the needle tip from being damaged by accumulated impurities, inadequate ion dispersion is resulted from the blowholes, and even though the additional discharge electrodes are disposed on the main discharge electrodes, the ion dispersion state cannot be changed.

3. Reducing the Life Span

High voltage is generated by the static eliminator via the electronic circuit, and ions are generated from the discharge needle, the life span of the circuit and the needle has its limitation, when the electrostatic balance is detected, ions are still continuously generated to reduce the life span.

Because static will not disappear automatically, as long as static exists, it causes damages which can lead to a loss of millions or even ten millions of dollars. To enhance the reliability of products and to prevent from the electrostatic damage, the method and equipment of electrostatic dissipation in present testing processes are desirable to be improved.

SUMMARY OF EMBODIMENTS OF THE INVENTION

Therefore, an objective of an embodiment of the present invention is to provide an electrostatic dissipation device with static sensing applicable to dissipate electrostatic charges on an object, comprising an ion transmitting unit, an ion generating unit, and a static sensing unit.

The ion transmitting unit includes a casting, an air flow generator disposed in the casting, and an air flow control circuit electrically connected to the air flow generator. The ion generating unit includes a circuit controller electrically connected to the air flow control circuit, an ion generating circuit electrically connected to the circuit controller, and at least one ion discharge needle disposed on the casting and electrically connected to the ion generating circuit. The static sensing unit includes a static sensor electrically connected to the circuit controller, and the static value is detected and provided as feedback to the circuit controller by the static sensor. When the static value on the object detected by the static sensor is negative, the ion generating circuit controlled by the circuit controller enables the ion discharge needle to generate positive ions only, furthermore, the air flow generator controlled by the circuit controller enables the air flow control circuit to generate adequate airflow, so that the positive ions are blown to the object for static neutralization. When the static value on the object detected by the static sensor is positive, the ion generating circuit controlled by the circuit controller enables the ion discharge needle to generate negative ions only, furthermore, the air flow control circuit controlled by the circuit controller enables the air flow generator to generate adequate air flow, so that the negative ions are blown to the object for static neutralization. When the static value is not detected by the static sensor, the operation of the ion generating circuit and the air flow generator are ceased by the circuit controller.

Another technique of an embodiment of the present invention is that the present invention further comprises a computer unit, which includes a monitor electrically connected to the circuit controller to display the information of present invention.

Another technique of an embodiment of the present invention is that the foregoing computer unit further includes an operating panel electrically connected to the circuit controller to receive external operating settings.

Another technique of an embodiment of the present invention is that the foregoing computer unit further includes an alarm electrically connected to the circuit controller to send out a warning.

Another technique of an embodiment of the present invention is that the foregoing computer unit further includes an output control port electrically connected to the circuit controller to send out an outage.

Another technique of an embodiment of the present invention is that the foregoing computer unit further includes a data storage electrically connected to the circuit controller to store the electrostatic dissipation information of objects.

Another objective of an embodiment of the present invention is to provide an electrostatic dissipation method with static sensing, comprising following steps:

First, in a first detecting step, a static dissipating zone is detected by a static sensor, and the detected information is transmitted to a circuit controller. Next, in a first shifting step, an object is shifted to the static dissipating zone. Then, in a static calculating step, the electrostatic information of the object is obtained, and a quantity of charge and a quantity of air flow for electrostatic dissipation are calculated by the circuit controller. Next, in an electrostatic dissipating step, an ion generating circuit controlled by the circuit controller enables the ion discharge needle to generate the charge quantity of electrostatic ions, and the electrostatic ions with polarity opposing to the static of the object are generated by the ion generating unit, and an air flow control circuit controlled by the circuit controller enables an air flow generator to blow the quantify of air flow, so that the electrostatic ions generated by the ion discharge needle are blown to the object for electrostatic dissipation. Then, in an electrostatic dissipation ceasing step, the operation of the ion generating circuit and the air flow generator are ceased by the circuit controller. Finally, in a second shifting step, the object completed with electrostatic dissipation is shifted from the static dissipating zone.

Another technique of an embodiment of the present invention is that the present invention further comprises a second detecting step occurring between the electrostatic dissipation ceasing step and the second shifting step. The static dissipating zone is continually detected by the static sensor, and the electrostatic information is transmitted to the circuit controller.

Another technique of an embodiment of the present invention is that the present invention further comprises an electrostatic warning step occurring between the second detecting step and the second shifting step. When the static value of the object is over the default value which determined by the circuit controller, a warning is sent out by an alarm and an outage is sent out by the output control port.

Another technique of an embodiment of the present invention is that the present invention further comprises a data storing step, the electrostatic information of the object is stored in a data storage.

An advantage of embodiments of the invention is that the electrostatic value of the static dissipating zone is continually detected by the static sensor; when the electrostatic value is detected which represents that the object enters into the static dissipating zone, the required charge and air flow quantity of the electrostatic dissipation is calculated by the circuit controller according to the static value of the object; the ion generating circuit controlled by the circuit controller enables the ion discharge needle to generate the quantity of electrostatic ions, and an air flow control circuit controlled by the circuit controller enables an air flow generator to blow the quantity of air flow, so that the electrostatic ions generated by the ion discharge needle are blown to the object for electrostatic dissipation. After finishing the electrostatic dissipation process, the operation of the on generating circuit and the air flow control circuit are ceased to reduce energy wasting of the present invention.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Specific structural and functional details disclosed herein will become apparent from the following descriptions of the two preferred embodiments of the present invention taken in conjunction with the accompanying drawings.

Before explaining the present invention in detail, it is to be understood that similar elements are labeled with the same reference numbers.

Figure 2:
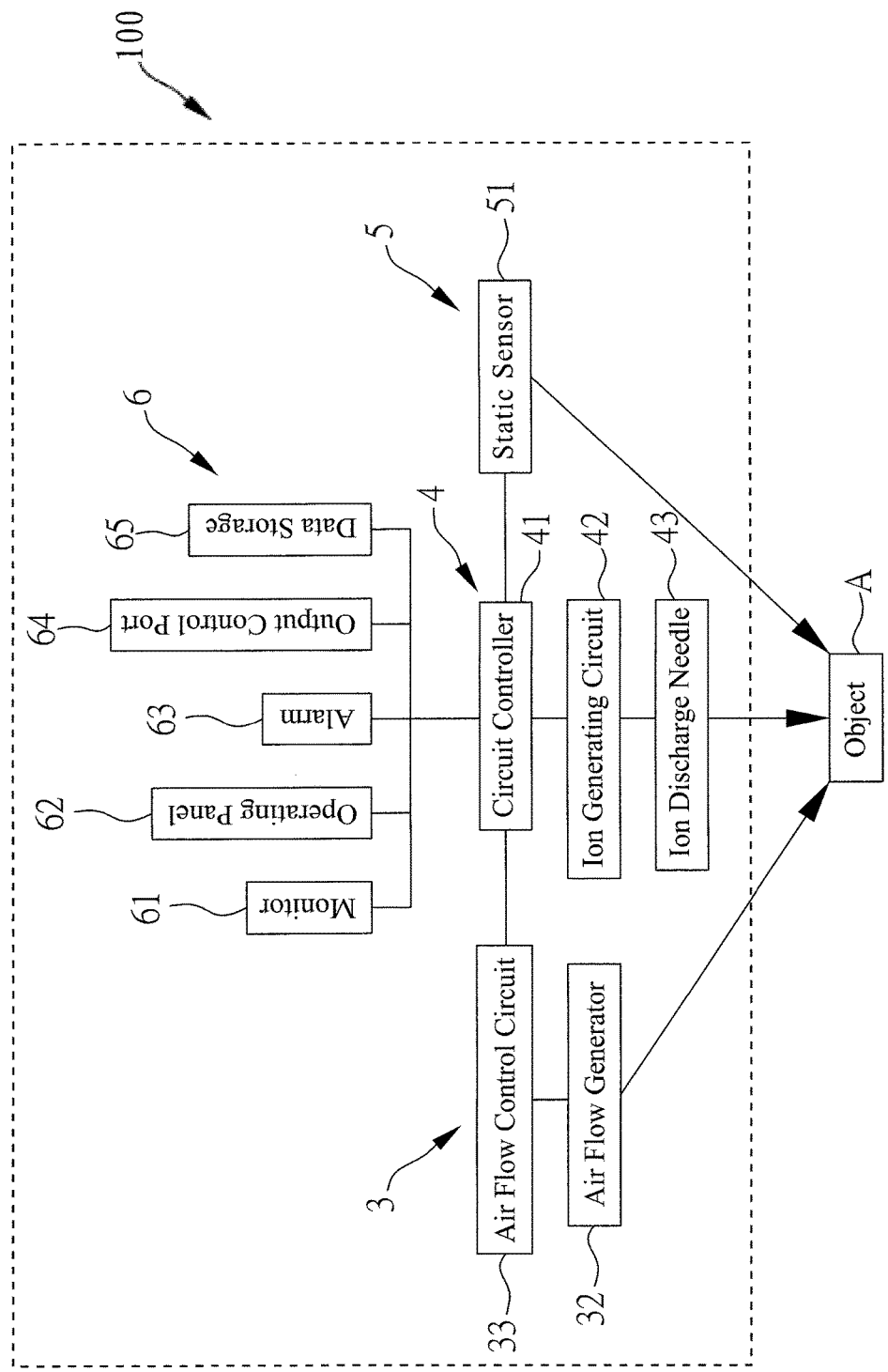
FIG. 2 is a flow chart depicting a first preferred embodiment according to an embodiment of the present invention.
Figure 3:
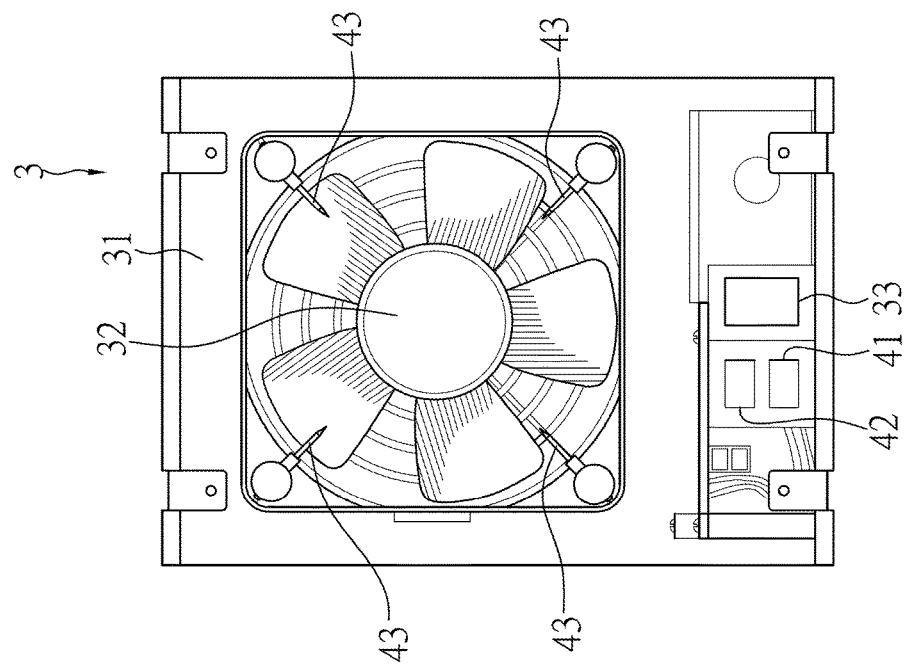
FIG. 3 is a flow chart depicting an arrangement of an ion transmitting unit in a first preferred embodiment according to an embodiment of the present invention.

With reference to FIGS. 2 and 3, a first embodiment of present invention is provided. An electrostatic dissipation device 100 with static sensing is applicable to dissipate electrostatic charges on an object A, comprising an ion transmitting unit 3, an ion generating unit 4, and a static sensing unit 5.

The ion transmitting unit 3 includes a casting 31, an air flow generator 32 disposed in the casting 31, and an air flow control circuit 33 electrically connected to the air flow generator 32. Preferably, the air flow generator 32 is a blower facility disposed in the casting 31, and the air flow control circuit 33 is a dc frequency converter circuit, by which the rotating speed and operation of the blower facility can be controlled. The technology of inverted blower is well-known for the person having ordinary skill in the art, so it will not be depicted herein anymore.

The ion generating unit 4 includes a circuit controller 41 electrically connected to the air flow control circuit 33, a ion generating circuit 42 electrically connected to the circuit controller 41, and at least one ion discharge needle 43 disposed on the casting 31 and electrically connected to the ion generating circuit 42. In the first embodiment of present invention, four ion discharge needles 43 are utilized.

It is worth mentioning that positive and negative ions are alternatively generated by the discharge electrode unit in the prior art device, and then the quantity of the positive and negative ions are controlled by the way of PWM. In contrast, the plural ion discharge needles 43 are driven by the ion generating circuit 42 to generate either positive ion or negative ion only, not in alternative way, in the present invention. Preferably, the ion generating circuit 42 is provided with a positive ion generating zone, and a negative ion generating zone; the positive and negative ion generating zones controlled by the circuit controller 41 drive the plural ion discharge needle to release positive or negative ion charge.

The static sensing unit 5 includes a static sensor 51 electrically connected to the circuit controller 41, and the static value of the object A is detected by the static sensor 51 and is provided as feedback to the circuit controller 41. The traditional analog signal is easily disturbed by the outside, so in the first embodiment of present invention, the detected electrostatic charges are converted into a digital sensing information and is sent to the circuit controller 41 by the digital static sensor 51 to prevent from outside disturbance. Furthermore, the ion generating circuit 42 is controlled by the circuit controller 41 by the way of a digital signal controller to prevent from outside disturbance. When in practice, other types of static sensor 51 also can be utilized, or static sensor chip is controlled via analog signal, and those shall not be construed as limiting the invention.

Figure 4:
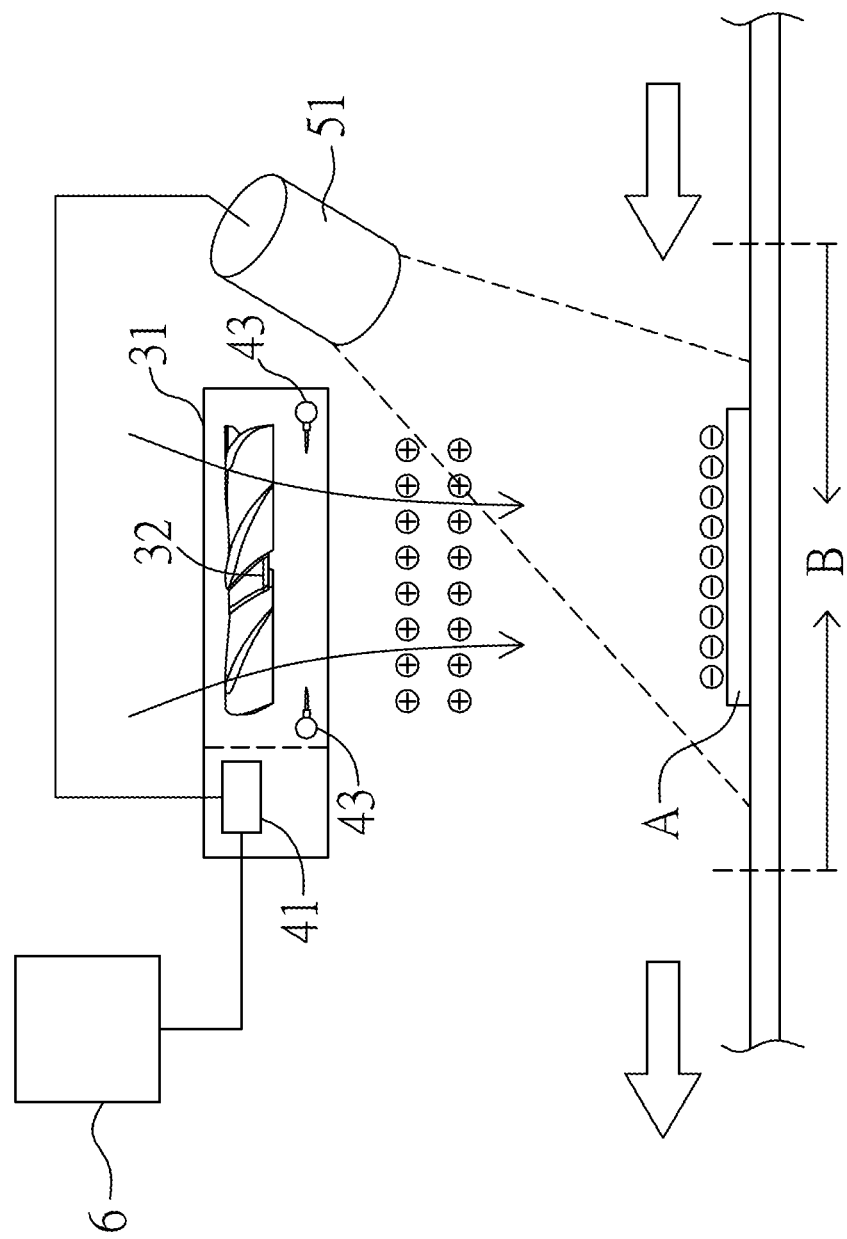
FIG. 4 is a flow chart depicting a state of dissipating negative static in a first preferred embodiment method according to an embodiment of the present invention.

With reference to FIG. 4, when the static value on the object A detected by the static sensor 51 is negative, the ion generating circuit 42 (as shown in FIG. 3) controlled by the circuit controller 41 enables the plural ion discharge needles 43 to generate positive ions only, and the air flow control circuit 33 (as shown in FIG. 3) controlled by the circuit controller 41 enables the air flow generator 32 to generate adequate air flow, so that the positive ions can be blown to the object A. The negative electrostatic charges of the object A and the positive ion charges generated by the present invention are neutralized to dissipate static value of the object A.

Figure 5:
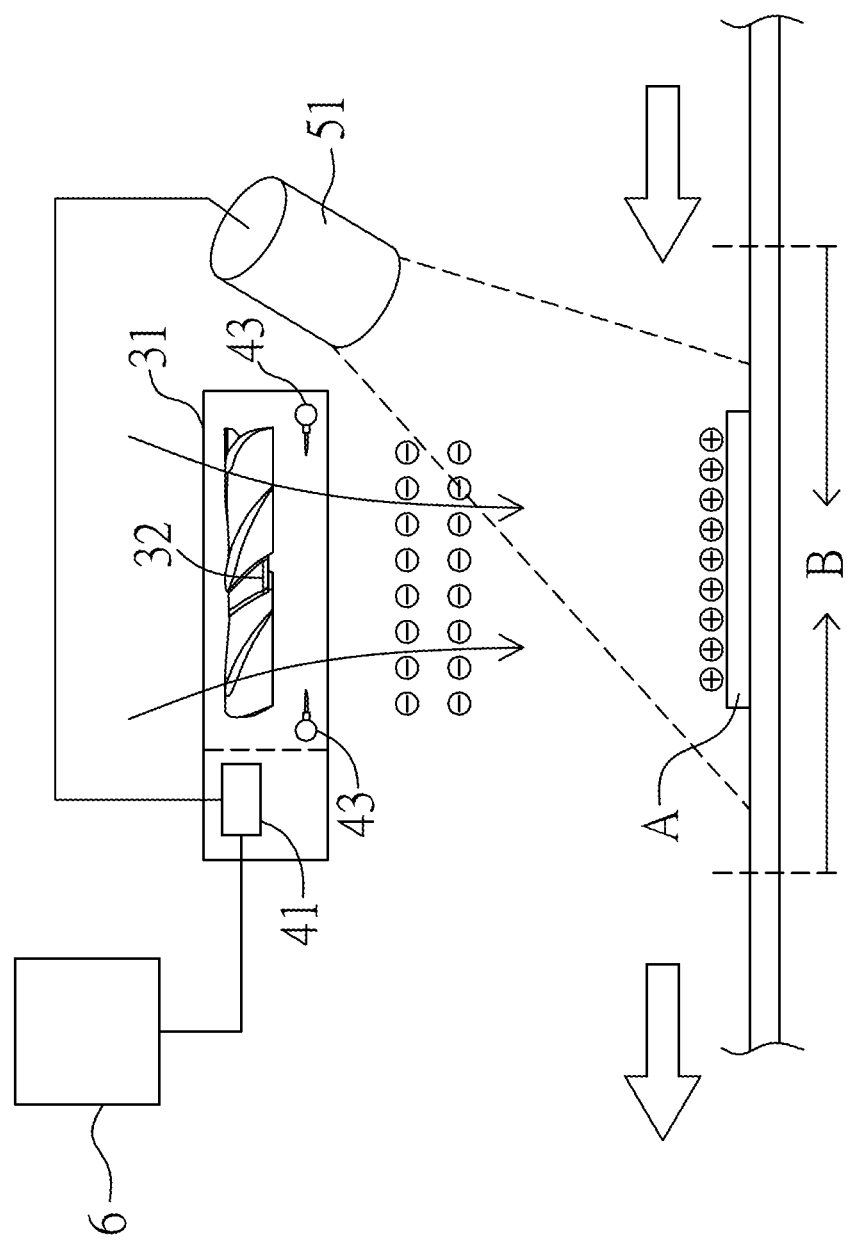
FIG. 5 is a flow chart depicting a state of dissipating positive static of a first preferred embodiment method according to an embodiment of the present invention.

With reference to FIG. 5, when the static value on the object A detected by the static sensor 51 is positive, the ion generating circuit 42 (as shown in FIG. 3) controlled by the circuit controller 41 enables the plural ion discharge needles 43 to generate negative ions only, and the air flow control circuit 33 (as shown in FIG. 3) controlled by the circuit controller 41 enables the air flow generator 32 to generate adequate air flow, so that the negative ions can be blown to the object A. The positive electrostatic charges of the object A and the negative ion charges generated by the present invention are neutralized to dissipate static value of the object A.

The electrostatic dissipation is performed by the way of PWM in the prior art device, when the positive static value is detected, the positive ions have still been released to the object A, on the other hand, when the negative static value is detected, the negative ions have still been released to the object A; when the positive ion charges encounter the positive static charges, or negative ion charges encounter negative static charges, the duration of the electrostatic dissipation is prolonged, and the static charges of the object A are increased.

Based upon the static value detected by the static sensor 51, ions with opposing polarity are generated by the present invention. When the positive static value is detected, the negative ion charges are generated by the ion generating unit 4; when the negative static value is detected, the positive ion charges are generated by the ion generating unit 4, so that neutralization can be simply performed to accelerate electrostatic dissipation.

When no static value has been detected by the static sensor 51, it represents that the static of the object A has been dissipated, or there is no object A in the zone detected by the static sensor 51, so the operation of the ion generating circuit 42 and the air flow generator 32 are ceased by the circuit controller 41 to reduce the energy wasting of the present invention.

Furthermore, with reference to FIG. 2, the present invention further comprise a computer unit 6, including a monitor 61 electrically connected to the circuit controller 41, an operating panel 62 electrically connected to the circuit controller 41, an alarm 63 electrically connected to the circuit controller 41, an output control port 64 electrically connected to the circuit controller 41, and a data storage 65 electrically connected to the circuit controller 41.

The information relative to the present invention or relative to the object A can be displayed by the monitor 61. For example, the working time of the present invention, the air flow quantity generated by the air flow generator 33, the preexisted static of the object A, the time and quantity of the ion charges utilized to dissipate the static of the object A, the static value of the object A after electrostatic dissipation, the time consumed by the present invention and so on, those information can be displayed by the monitor 61.

The external operating settings can be received by the operating panel 62, and usually is applicable to maintain or adjust the present invention. The adjustment is operated by the technical staff to precisely dissipate the static value of the object A, or the static acceptable value of the object A can be set up, and the acceptable value is the maximum acceptable value after object A completed with electrostatic dissipation. Preferably, the monitor 61 and the operating panel 62 can be integrated into a touch panel, so that the information of the circuit controller 41 can directly be obtained, and the circuit controller 41 can be set up.

When the static charges of the object A are dissipated by this present invention, the static value detected by the static sensor 51 is over the acceptable value, it represents that the static charges of the object A are not fully dissipated, and a warning will be sent out by the alarm 63, and an outage will be sent out by the output control port 64.

The warning can be sent out via sound or light by the alarm 63, or by the way of information transmission to inform the faraway technical staff, so they can quickly arrive to undergo examination and maintenance. The operation of the shifting facility for shifting the object A is ceased by the outage sent out from the output control port 64, so the object A with static will not be shifted to the next process to prevent the product from electrostatic damage.

The electrostatic dissipation information of the object A is stored by the data storage 65. The present invention is applicable to the automatic production equipment, the plural objects A are examined in bulk and the electrostatic dissipation is performed. The electrostatic information of each object A is stored by the data storage 65, so that the data can be read and compared by other technical staff for following maintenance reference.

Besides, the data stored in the data storage 65 provides the product traceability of the object A to downstream manufacturers for further understanding of the product manufacturing processes, and the manufacturing process can be controlled precisely. Preferably, the data can be stored via computer by the data storage 65, and when in practice, it also can be stored in the remote database via Internet, and those shall not be construed as limiting the limitation.

Figure 6:
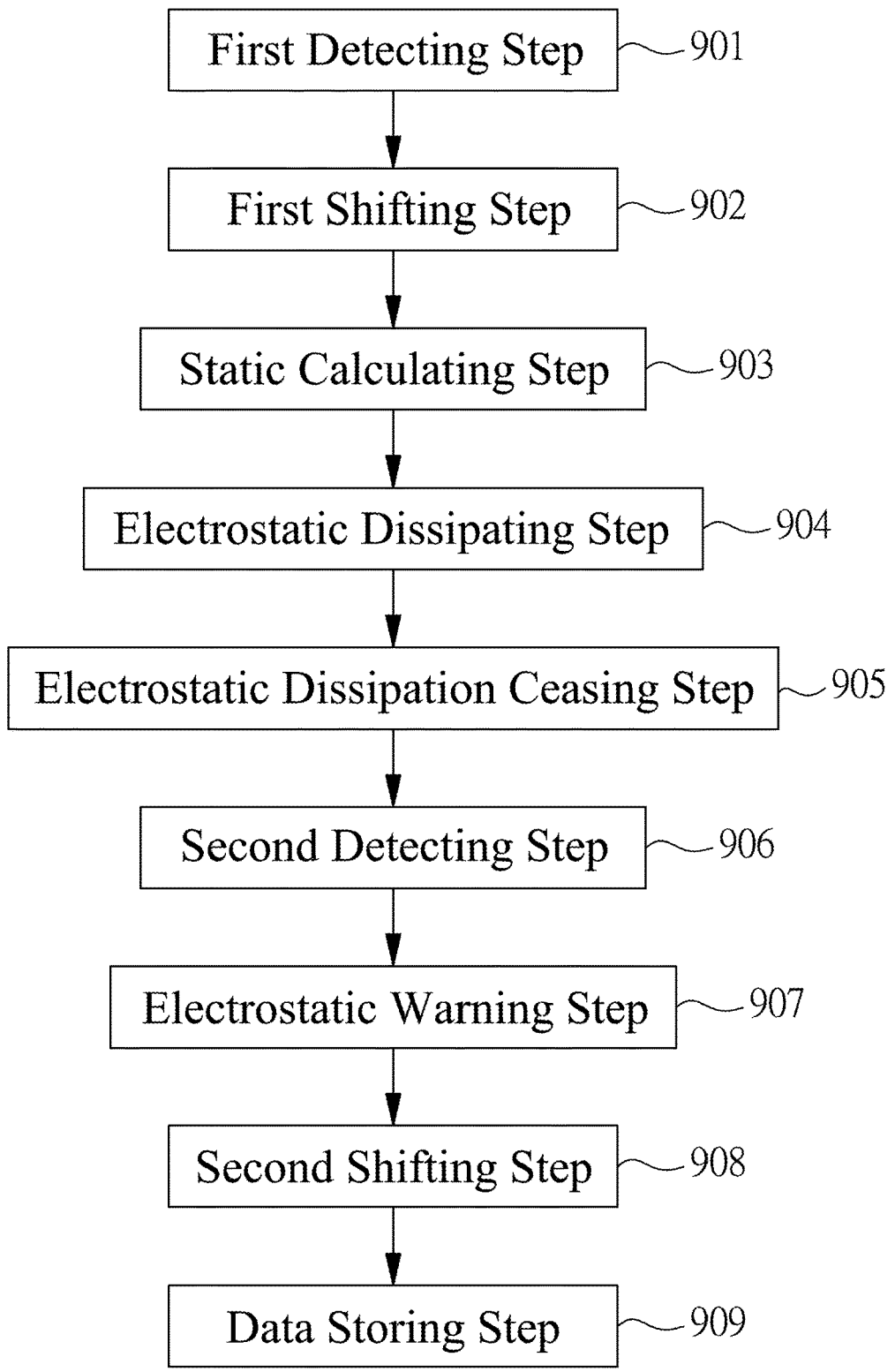
FIG. 6 is a flow chart depicting a second preferred embodiment according to an embodiment of the present invention.

With reference to FIG. 6, a second embodiment of present invention is provided. An electrostatic dissipation method with static sensing is applicable to the electrostatic dissipation device with static sensing, comprising the following steps:

With reference to FIGS. 4 and 5, first, in a first detecting step 901, a static dissipating zone B is detected by a static sensor 51, and the detected information is transmitted to the circuit controller 41. In general, the static sensor 51 on the market is provided with a static sensing angle, and the static sensing operation of the object A can only be performed at the predetermined angle.

Figure 1:
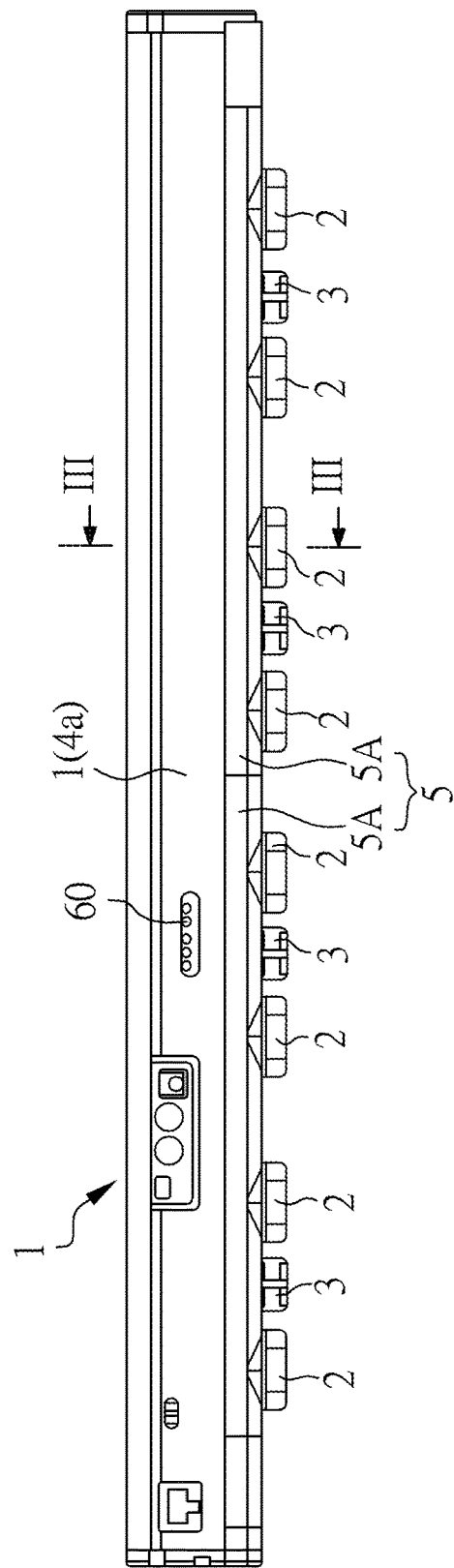
FIG. 1 is a flow chart of a prior art device disclosed in Taiwan Invention Patent No. 1435659, showing a static eliminator.

The static sensing value is sharply declined following with the enlarged sensing distance, so the static sensing distance of the static sensor 51 shall be taken into account, and furthermore, precise electrostatic information can be obtained. Preferably, the distance between the static sensor 51 and the object A can be set up by the operating panel 62 (as shown in FIG. 1) of the computer unit 6.

Next, in a first shifting step 902, the object A is shifted to the static dissipating zone B. In the second preferred embodiment, the object A is shifted by the way of conveyor belt, and the static dissipating zone B is one part of the conveyor belt. Preferably, the conveyor belt is made of anti-static material to avoid generating static. When in practice, the operation of shifting the object A can be performed by other methods, and shall not be construed as limiting the invention.

Then, in a static calculating step 903, the electrostatic information of the object A is obtained by the circuit controller 41, and a quantity of charge and a quantity of air flow for electrostatic dissipation are calculated. In general, the static value of the object A shall be neutralized by equivalent charges with opposing polarity to dissipate the static charges of the object A. Besides, during transmitting process, ions with polarity charges will be neutralized with ions in the air, and the ions with polarity charges are declined sharply.

The accurate charge quantity is calculated by the circuit controller 41 through predetermined distance, and the ions with polarity charges are blown to the object A by the correct air flow quantity. When the static value is detected by the static sensor 51, it represents that an object A enters into the static dissipating zone B, and the accurate charge and air flow quantity can be calculated by the circuit controller 41 of the ion generating unit 4 through the detected static value and predetermined distance.

Next, in an electrostatic dissipating step 904, the ion generating circuit 42 controlled by the circuit controller 41 enables the plural ion discharge needles 43 to generate the charge quantity of electrostatic ions. The polarity of the electrostatic ions generated by the plural ion discharge needles 43 is opposing to the static of the object A, and the air flow control circuit 33 (as shown in FIG. 3) controlled by the circuit controller 41 enables the air flow generator 32 to generate air flow quantity, so the electrostatic ions generated by the plural ion discharge needles 43 are blown to the object A for electrostatic dissipation.

The foregoing ion discharge quantity of the object A is accumulated by the operation time of air flow generator 32. The instant ion generating quantity of the ion discharge needle 43, and the variable factor of the ion blowing are considered by the circuit controller 41 to control the operation time of the air flow generator 32, so the ion quantity of the object A can be controlled precisely, and the electrostatic dissipation of the object A can be performed.

The static of the object A in the static dissipating zone B is continually detected by the static sensor 51, preferably, the ion generating circuit 42 and the air flow control circuit 33 are controlled by the circuit controller 41 via proportional-integral-derivative control circuit (PID control circuit). PID control circuit is a common component of feedback loop in industrial control application, and is also well-known for the person having ordinary skill in the art, so it will not be depicted herein anymore. When in practice, the other control circuits can also be utilized, and shall not be construed as limiting the invention.

Then, in an electrostatic dissipation ceasing step 905, when the electrostatic dissipation of the object A is completed, the operation of the ion generating circuit 42 (as shown in FIG. 3) and the air flow generator 32 are ceased by the circuit controller 41 to reduce energy wasting of the present invention.

In the prior art device, the positive and negative ions are generated alternatively by the way of PWM, and when the electrostatic dissipation of the object A is completed, or no static value is detected in the electrostatic dissipating zone B, the air flow is continually generated by the prior art device, and the positive and negative ions are blown to the electrostatic dissipating zone B to cause energy wasting.

In contrast, after the electrostatic dissipation of the object A is completed by the present invention, the operation of the ion generating circuit 42 and the air flow generator 32 are ceased by the circuit controller 41, so that it cannot only reduce the energy wasting, but also extend the life span of the present invention without unnecessary operation.

Next, in a second detecting step 906, the electrostatic dissipating zone B is continually detected by the static sensor 51, and the electrostatic information of the object A is transmitted to the circuit controller 41. The second detecting step 906 is performed to confirm the electrostatic dissipation of the object A, so remaining static value can be prevented after the operation of the ion generating circuit 42 and the air flow generator 32 are ceased.

Then, in an electrostatic warning step 907, when the static value of the object A is over the default value which is determined by the circuit controller 41, a warning is sent out by an alarm 63 (as shown in FIG. 1) and an outage is sent out by the output control port 64 (as shown in FIG. 1). The main objective of the present invention is to dissipate the static value of the object A, and zero static value (charge balance) can be detected by the static sensor 51 of the static sensing unit 5, but it cannot prevent the object A from impact of the external charge, the operating panel 62 is utilized by the technical staff to set up the static acceptable value of the object A.

When the static value of the object A is below the acceptable value, it represents that the object A is a qualified product with electrostatic dissipation; when the static value of the object A is over the acceptable value, it represents that there are some problems with the present invention or the object A, the alarm 63 is controlled by the circuit controller 41 to send out a warning, so that the technical staff is informed for maintenance and examination on the spot. The outage is sent to the whole production line by the output control port 64, and the manufacturing processes are ceased to prevent the object A with static from being shifted to the next process, so that the quality of product will not be impacted.

Next, in a second shifting step 908, the object A completed with electrostatic dissipation is shifted from the static dissipating zone B. The operation of the present electric circuit is faster, so the time of sensing and dissipating the static value of the object A is short, and the electrostatic dissipation of the object A in the static dissipating zone B can be completed by adjusting the speed of the conveyor belt. The object A can continuously feed and discharge convenient to the automatic production equipment, when in practice, the object A can also be stopped at the static dissipating zone B, and is shifted from the static dissipating zone B after completing electrostatic dissipation, and shall not be construed as limiting the invention.

Finally, in the data storing step 909, the electrostatic information of the object A is stored in a data storage 65 (as shown in FIG. 1) by the circuit controller 41. The record of the object A before and after electrostatic dissipation is stored in the data storage 65, and can be provided to downstream processes or manufacturers for reference. Moreover, when the present invention is out of order, the record can also be provided to the technical staff for diagnosing problem.

With the aforementioned descriptions, the following benefits of the present invention can be obtained:

1. Fast Balance Speed

Based upon the static value detected by the static sensor 51, ions with opposing polarity are generated by the present invention. When the positive static charges are detected, the negative ion charges are generated by the ion generating unit 4; when the negative static value is detected, the positive ion charges are generated by the ion generating unit 4, so that neutralization can be simply performed on the object A to accelerate ion balance for electrostatic dissipation.

2. Saving Energy

When no static value has been detected by the static sensor 51, it represents that the static of the object A has been dissipated, or there is no object A in the zone detected by the static sensor 51, so the operation of the ion generating circuit 42 and the air flow generator 32 has been ceased by the circuit controller 41 to reduce the energy wasting of the present invention.

3. Long Life Span

The electrostatic dissipation of the object A is completed by the present invention, and the operation of the ion generating circuit 42 and the air flow generator 32 are ceased by the circuit controller 41, so that it cannot only reduce the energy wasting, but also extend the life span of the present invention without unnecessary operation.

In conclusion, based upon the static value detected by the static sensor 51, ions with opposing polarity generated by the circuit controller 41 are blown to the object A by the air flow control circuit 33 for neutralization. It can accelerate the electrostatic dissipation of the object A, and when no static value is detected by the static sensor 51, the operation of the ion generating circuit 42 and the air flow generator 32 has been ceased to reduce the energy wasting of the present invention and to extend its life span, so the objectives of the present invention can be obtained.

The foregoing detailed description is merely in relation to two preferred embodiments and shall not be construed as limiting the invention. It is to be understood that many other possible modifications and variations can be made without departing from the spirit and scope of the invention as hereinafter claimed.

What is claimed is:

1. An electrostatic dissipation device with static sensing applicable to dissipate electrostatic charges on an object, comprising:
   an ion transmitting unit, including a casting, an air flow generator disposed in the casting, and an air flow control circuit electrically connected to the air flow generator;
   an ion generating unit, including a circuit controller electrically connected to the air flow control circuit, an ion generating circuit electrically connected to the circuit controller, and at least one ion discharge needle disposed on the casting and electrically connected to the ion generating circuit; and
   a static sensing unit, including a static sensor electrically connected to the circuit controller, and a static value is continuously detected and provided as feedback to the circuit controller by the static sensor, the circuit controller being configured to calculate a quantity of charge and a quantity of airflow for electrostatic dissipation;
   when the static value on an object is detected by the static sensor is negative, the ion generating circuit controlled by the circuit controller enables the ion discharge needle to generate positive ions only, furthermore, the air flow generator controlled by the circuit controller enables the air flow control circuit to generate adequate airflow, wherein the positive ions are blown to the object for static neutralization; when the static value on the object is detected by the static sensor is positive, the ion generating circuit controlled by the circuit controller enables the ion discharge needle to generate negative ions only, furthermore, the air flow control circuit controlled by the circuit controller enables the air flow generator to generate adequate air flow, wherein the negative ions are blown to the object for static neutralization; when the static value is not detected by the static sensor, the operation of the ion generating circuit and the air flow generator are ceased by the circuit controller,
   wherein an amount of the air flow is adjusted by the static value as detected.

2. The device as claimed in claim 1, further comprising a computer unit, which includes a monitor electrically connected to the circuit controller to display information of present invention.

3. The device as claimed in claim 2, wherein the computer unit further including an operating panel electrically connected to the circuit controller to receive external operating settings.

4. The device as claimed in claim 2, wherein computer unit further including an alarm electrically connected to the circuit controller to send out a warning.

5. The device as claimed in claim 2, wherein the computer unit further including an output control port electrically connected to the circuit controller to send out an outage.

6. The device as claimed in claim 2, wherein the computer unit further including a data storage electrically connected to the circuit controller to store the electrostatic dissipation information of objects.

7. An electrostatic dissipation method with static sensing, comprising steps of:
- a) a first detecting step, wherein a static dissipating zone is continuously detected by a static sensor, and a detected information is transmitted to a circuit controller;
- b) a first shifting step, wherein an object is shifted to the static dissipating zone;
- c) a static calculating step, wherein an electrostatic information of the object is obtained, and a quantity of charge and a quantity of air flow for electrostatic dissipation are calculated by the circuit controller;
- d) an electrostatic dissipating step, wherein an ion generating circuit controlled by the circuit controller enables an ion discharge needle to generate a charge quantity of electrostatic ions, and the electrostatic ions with polarity opposing to a static of the object are generated by the ion generating circuit, and an air flow control circuit controlled by the circuit controller enables an air flow generator to blow the quantify of air flow, wherein the electrostatic ions generated by the ion discharge needle are blown to the object for electrostatic dissipation;
- e) an electrostatic dissipation ceasing step, wherein an operation of the ion generating circuit and the air flow generator are ceased by the circuit controller; and
- f) a second shifting step, the object completed with electrostatic dissipation is shifted from the static dissipating zone, wherein an amount of the air flow is adjusted by the static value as detected.

8. The method as claimed in claim 7, further comprising a second detecting step occurring between an electrostatic dissipation ceasing step and the second shifting step; the static dissipating zone is continually detected by the static sensor, and the electrostatic information is transmitted to the circuit controller.

9. The method as claimed in claim 8, further comprising an electrostatic warning step occurring between the second detecting step and the second shifting step; when a static value of the object is over a default value which determined by the circuit controller, a warning is sent out by an alarm and an outage is sent out by a output control port.

10. The method as claimed in claim 9, further comprising a data storing step, the electrostatic information of the object is stored in a data storage.

* * * * *